(12) United States Patent
Escobar K'David

(10) Patent No.: US 11,284,661 B2
(45) Date of Patent: Mar. 29, 2022

(54) MULTI-FEATURED MINIATURE CAMERA

(71) Applicant: Carlos Eduardo Escobar K'David, Rosharon, TX (US)

(72) Inventor: Carlos Eduardo Escobar K'David, Rosharon, TX (US)

(*) Notice: Subject to any disclaimer, the term of this patent is extended or adjusted under 35 U.S.C. 154(b) by 0 days.

(21) Appl. No.: 15/980,824

(22) Filed: May 16, 2018

(65) Prior Publication Data
US 2019/0269190 A1 Sep. 5, 2019

(51) Int. Cl.
| | |
|---|---|
| *A42B 3/04* | (2006.01) |
| *H04N 21/422* | (2011.01) |
| *H04N 5/33* | (2006.01) |
| *G01S 19/14* | (2010.01) |
| *G06K 7/10* | (2006.01) |
| *H02J 50/70* | (2016.01) |
| *H02J 50/80* | (2016.01) |
| *H04W 4/10* | (2009.01) |
| *H05K 5/06* | (2006.01) |
| *G01J 5/02* | (2006.01) |
| *H04M 1/72412* | (2021.01) |

(52) U.S. Cl.
CPC .......... *A42B 3/0433* (2013.01); *G01J 5/0215* (2013.01); *G01S 19/14* (2013.01); *G06K 7/10009* (2013.01); *H02J 50/70* (2016.02); *H02J 50/80* (2016.02); *H04M 1/72412* (2021.01); *H04N 5/33* (2013.01); *H04N 21/42203* (2013.01); *H04W 4/10* (2013.01); *H05K 5/06* (2013.01); *H04M 2250/02* (2013.01)

(58) Field of Classification Search
CPC ...... A42B 3/0433; G01J 5/0215; H04W 4/10; H02J 50/80; H02J 50/70; H05K 5/06; G06K 7/10009; G01S 19/14; H04N 5/33; H04N 21/42203; H04M 2250/02; H04M 1/7253
See application file for complete search history.

(56) References Cited

U.S. PATENT DOCUMENTS

| | | | | |
|---|---|---|---|---|
| 10,069,689 | B1* | 9/2018 | Derby | H04L 41/12 |
| 2005/0200750 | A1* | 9/2005 | Ollila | H04N 5/772 |
| | | | | 348/375 |
| 2008/0125042 | A1* | 5/2008 | Kim | H04M 1/6066 |
| | | | | 455/41.2 |
| 2010/0045928 | A1* | 2/2010 | Levy | H04M 1/05 |
| | | | | 351/158 |

(Continued)

OTHER PUBLICATIONS

Pryme (PRYMEBLU® BT-PTT Push-to-Talk User's Guide, version 1.1, published Jan. 2018 (Year: 2018).*

*Primary Examiner* — Nasim N Nirjhar

(57) ABSTRACT

The present invention proposes a multi-featured miniature camera. The components of the camera mainly comprise of an image capturing means, multiple activating means, an infrared radiating means, a microphone, multiple Bluetooth connection means, an identification chip means, a wireless power charging means, a wireless data transfer means, an image processing means and a location determination means. The camera provides wireless power and data transfer, image recognition, Push-To-Talk (PTT) function, multiple Bluetooth communication etc. This multi-featured camera is mounted on different application areas such as on the helmet of police officers, sport players, firefighters etc. The camera body is designed in such a way, that it easily fits on the helmet.

4 Claims, 7 Drawing Sheets

(56) References Cited

U.S. PATENT DOCUMENTS

| | | | |
|---|---|---|---|
| 2013/0229529 A1* | 9/2013 | Lablans | H04N 5/23238 348/169 |
| 2014/0193336 A1* | 7/2014 | Rousso | A61K 51/0476 424/1.65 |
| 2014/0273678 A1* | 9/2014 | Meyer | B63B 22/22 441/31 |
| 2015/0031288 A1* | 1/2015 | Tubbesing | H04W 4/80 455/41.1 |
| 2016/0197522 A1* | 7/2016 | Zeine | H02J 5/005 307/104 |
| 2016/0352156 A1* | 12/2016 | Desai | H02J 50/12 |
| 2018/0103206 A1* | 4/2018 | Olson | H04N 5/2252 |
| 2019/0318035 A1* | 10/2019 | Blanco | G06F 16/9535 |

\* cited by examiner

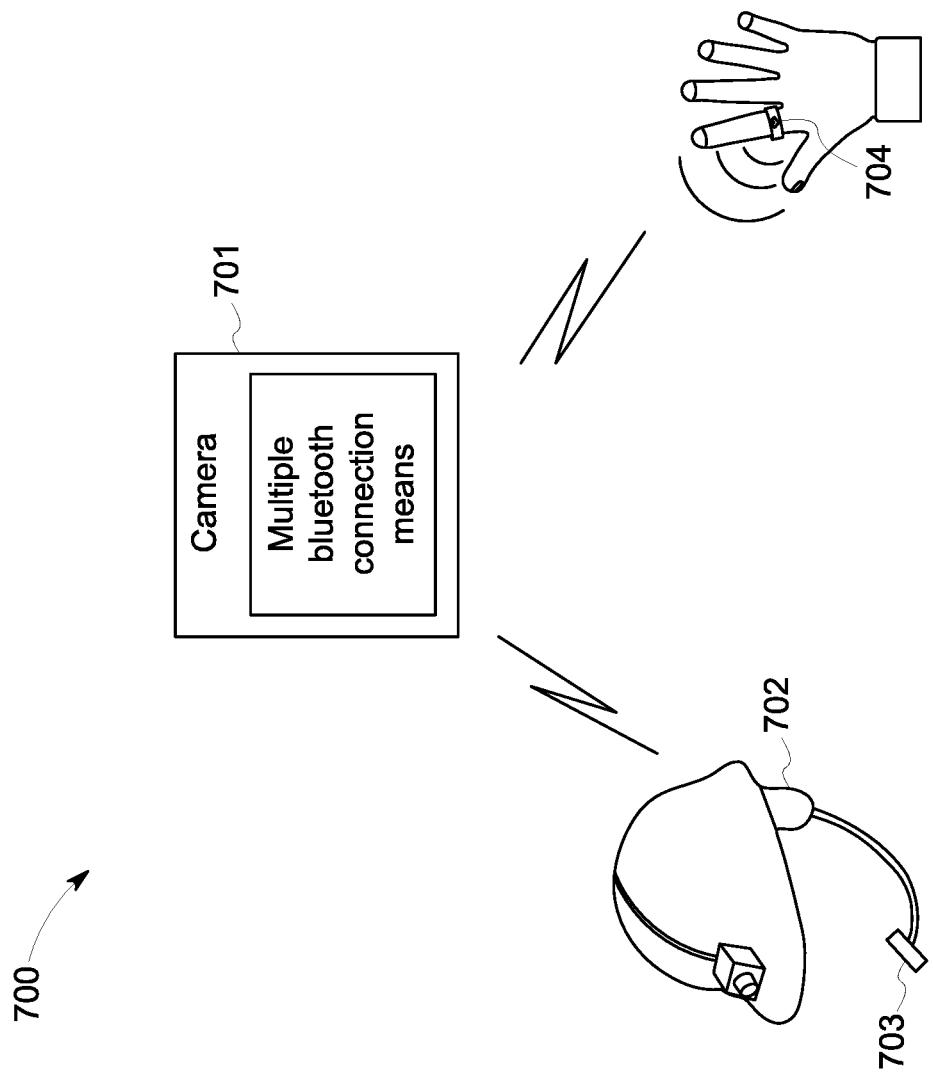

MULTI-FEATURED MINIATURE CAMERA

FIELD OF INVENTION

The present invention relates to a miniature camera, and in particular to a multi-featured miniature camera assembly, designed to be small and which incorporates multiple features such as wireless power and data transfer, image recognition, Push-To-Talk (PTT) function, multiple Bluetooth communication etc. The camera can be mounted on different application areas such as on helmet of police officers, sport players, firefighters etc.

BACKGROUND OF THE INVENTION

With the advent of miniature cameras, these are commonly used now-a-days in wide variety of applications such as security purposes, police search operations, industries, sports, parking bays etc. have dramatically proliferated. The usages of such miniature cameras allow the user to monitor interested areas from multiple directions. CCD cameras can be hidden in numerous locations such as in pocketbooks, behind walls, in ceilings and within ordinary objects. This helps to record moving or still images using variable focus, optical zoom and different image stabilization techniques. Many companies or industries today must use hidden cameras as an additional security measure in order to protect their inventory, premises and customers. Cameras are also being used more frequently in the home for the protection of children and personal property.

Tremendous advancements have been evolved in camera technologies today which involve either higher performance or image quality or improved features or compact size. This evolvement often leads to conflict in the market, as higher performance; improved features and image quality require large camera size. Sometimes, high performance and improved features lead to the less quality. Consumers always prefer to procure cameras which are small in size with high quality images and more improved features. Hence, the objective is to provide consumers a miniature camera with multiple improved features through which the consumer may utilize the camera in multiple application areas.

Cameras are becoming smaller and more powerful while getting packed with more and more features. Different components are integrated to the camera such as flashes, audio decks, transceivers etc. Those components are also available in smaller size which as a whole makes the camera size small. Thus, mounting of these cameras in different application areas require additional mounting components to fix them in position securely. Despite of that, some cameras are manufactured with integrated mounting means that assist in mounting the camera on required application area. For example, having a more featured camera to be built on helmet require an easy fit design. Further, the cameras used have significant weight which causes problems like getting detached when placed on helmets or mounted on any other place. Therefore, there is a need to provide a camera with a special design that easily fits on the helmet and also of light in weight.

In general, a camera which is operated by different users or police guards comprise of a single Bluetooth communication. By utilizing such connection, only a single communication can be accomplished such as connecting either a Bluetooth enabled earphones or a Bluetooth enabled mouthpiece etc. Such cameras do not have a feature to enable three or more Bluetooth enabled accessories simultaneously with a provision to communicate with multiple devices. Some cameras are connected with intermediate accessories that allow connecting multiple Bluetooth enabled accessories either simultaneously or individually. In order to avoid such problem, there is a need to provide a miniature camera with three or more Bluetooth enabling features which would allow the device to communicate with multiple Bluetooth enabled accessories simultaneously.

Cameras are employed with different emerging technologies such as information processing, speech recognition, image recognition etc. The image recognition process allows for recognizing each of the specific images recorded by the camera. The recognition process involves detection of size of the deviation of the specific image from the predetermined reference position, magnitude of the deviation and thereof. The other technology that enables the recorded images to send to a group of devices is cluster communication. This allows the user to easily send images to an already existed group or a new group.

Therefore, an object of the invention is to provide a miniature camera with multiple improved features through which the consumer may mount the camera on multiple application areas such as on helmet of police officers, sport players, firefighters etc. There is a need to provide the miniature camera with a special design that easily fits on the helmet with a light weight. The miniature camera should be capable of having multiple Bluetooth connection means that allow the device to connect with multiple Bluetooth enabled accessories either individually or simultaneously. The other object is to employ image recognition process and also to provide cluster communication.

Thus, the most desirable solution is to obtain a compact and lightweight camera that overcomes the traditional camera drawbacks, provides a real-time image synchronization, allows to cover wider field of view and achieves enhanced image clarity. The solutions required include a water resistant camera, a convenient recharging of the battery, an increased memory storage, an easy communicative system to transfer images and an easy placement of the camera which conventional devices are struggling to address.

SUMMARY OF THE INVENTION

The invention proposes a multi-featured miniature camera. The following presents a simplified summary in order to provide a basic understanding of some aspects of the claimed subject matter. This summary is not an extensive overview. It is not intended to identify key/critical elements or to delineate the scope of the claimed subject matter. Its sole purpose is to present some concepts in a simplified form as a prelude to the more detailed description that is presented later.

The present invention relates to a miniature camera embedded within the helmet and capable of capturing images and transmitting the images wirelessly in real-time. The proposed camera is equipped with multiple features that avoid multiple other accessories to be additionally mounted on the helmet. The camera of the present invention is comprised of light weight with multiple features. The invention mainly aims to provide a helmet mounted camera which can be mounted on the helmets of the police officers, firefighters, traffic police officers, underground mining detecting, real-time navigation positioning function, a hands-free voice communications projection display and thereof.

The camera of the present invention is configured to be water resistant and comprises of wide memory storage. The camera is further incorporated with multiple wireless communications such as Bluetooth, Wi-Fi, and any one or combination of 2G, 3G or 4G. A special design is provided to the camera to easily fit on the helmet and to ensure stable image capturing. The invention therefore as a whole provides a camera which is compact and light weighted, easy to mount and simple to operate.

To achieve the above object, the present invention adopts the technical solution as follows:

According to an aspect, the present invention discloses a multi-featured miniature camera comprising an image capturing means to capture images, wherein the image capturing means comprises at least one rotatable lens through which the viewing angle is enhanced and information captured in the images is also increased. The image capturing means can capture either moving or still images. Further, multiple activating means like sensors or push buttons are used to activate multiple features of the miniature camera. The multi-featured camera has an infrared radiating means and sensors to capture the infrared assisted images where the images are captured manually or automatically as per the selection of the user. The multi-featured miniature camera includes at least a microphone and a speaker to assist the communication. The multi-featured miniature camera also includes multiple Bluetooth connection means to connect multiple Bluetooth enabled accessories like ear-piece, mouth piece and finger ring whereby multiple Bluetooth devices help in communicating information from different devices or accessories of the miniature camera at a time without any time lapse and thereby increase the communication efficiency.

Further, in another aspect of the present invention, the multi-featured miniature camera has a provision of wireless power charging where the wireless power charging is attained by a magnetic wireless power charging means. Magnetic wireless data transfer provision is also provided to transfer data effectively and the data transfer also has the provision to transfer data using cluster communication where the data can be of still image data or moving images data. The image processing means is included to the system to process the image and to recognize the image.

Further, the present invention does task like the noise reduction, the video and audio recordings. Features like Global Positioning System (GPS) is provided to the miniature camera to easily track the location of the camera. The camera is mounted on a helmet and the contour design of the camera helps to easily get aligned on the helmet. The camera also has the provision for Subscriber Identity Module (SIM) card or Wi-Fi provision to communicate the images or information or videos to the required destination as and when the images or videos or information is captured. Bluetooth enabled finger ring is provided with a Push-To-Talk (PTT) function to enable the miniature camera to capture images or to communicate using a microphone. The miniature camera is a light weight device, ranging from 100 grams to 140 grams and water resistant, where the camera can be used up to 10 feet depth in water.

In other aspects, the GPS is provided with a receiver integration to enable tracking of the location of the camera and in turn to acquire image information. The GPS receiver enables periodic capture of location and provides the details of the captured images such as location, speed, time and thereof.

DESCRIPTION OF DRAWINGS

The accompanying drawings, which are incorporated in and constitute a part of the specification, illustrate an embodiment of the invention, and, together with the description, serve to explain the principles of the invention.

FIG. 7 illustrates a multiple Bluetooth connection means that connects multiple Bluetooth enabled accessories.

DETAILED DESCRIPTION OF DRAWINGS

Figure 1:
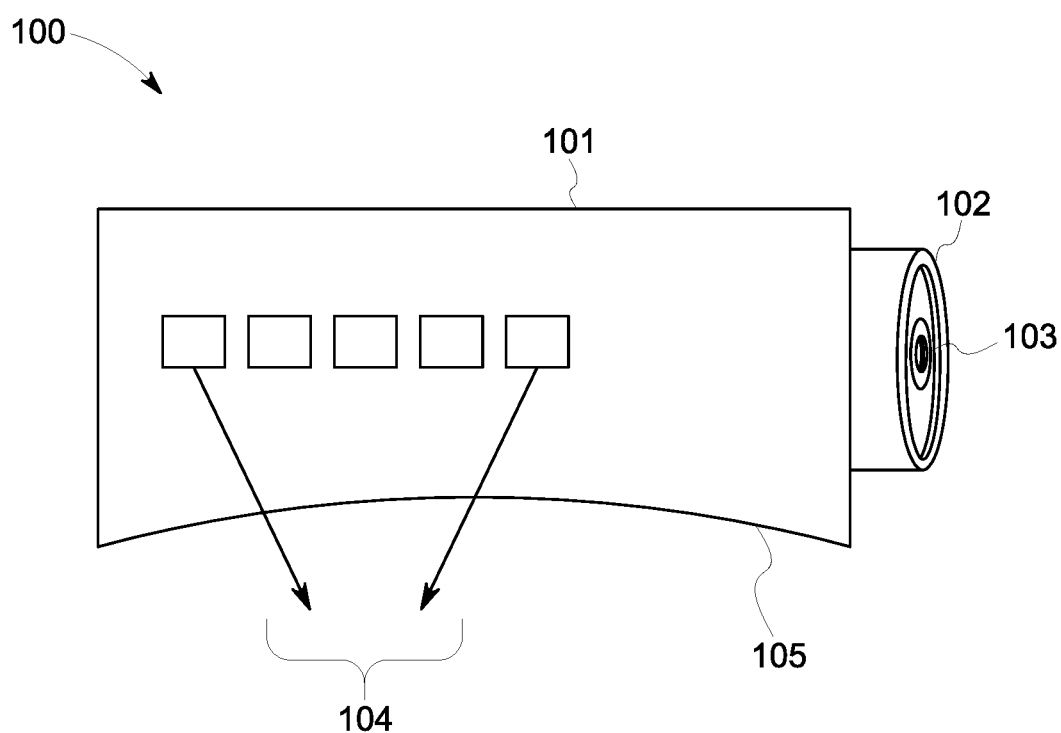
FIG. 1 depicts an exemplary view of the multi-featured miniature camera according to an exemplary embodiment of the invention.

An exemplary embodiment of the present invention will be described in reference to the accompanying drawings. Wherever possible, same or similar reference numerals are used in the drawings and the description to refer to the same or like parts or steps.

For explanatory purposes of this description, the term "camera" is intended to cover different types of cameras and camcorders. The exemplary miniature camera is designed to mount on a helmet and configured to record either visual or audio data. Referring to FIG. 1, the exemplary multi-featured miniature camera 100 comprises a camera body 101, an image capturing module 102, a rotatable lens 103 and multiple activating switches such as buttons 104. The camera body 101 is formed into a contour design to easily align and fit onto the helmet. This mainly aids users in police search operations, sports, firefighting etc.

The image capturing means 102 is configured to capture either moving or still images. The image capturing means 102 comprises a rotatable lens 103. The camera 100 may comprise second rotatable lens which is not shown in the figure. Thus, the camera 100 is configured with two rotatable lenses to effect the photographic image in a predetermined predictable manner. The buttons 104 are configured on the side part of the camera body 101 to activate multiple features. The other components that are configured within the camera 100 are a speaker and a USB port which may support OTG cable, power charging and data transfer.

Figure 2:
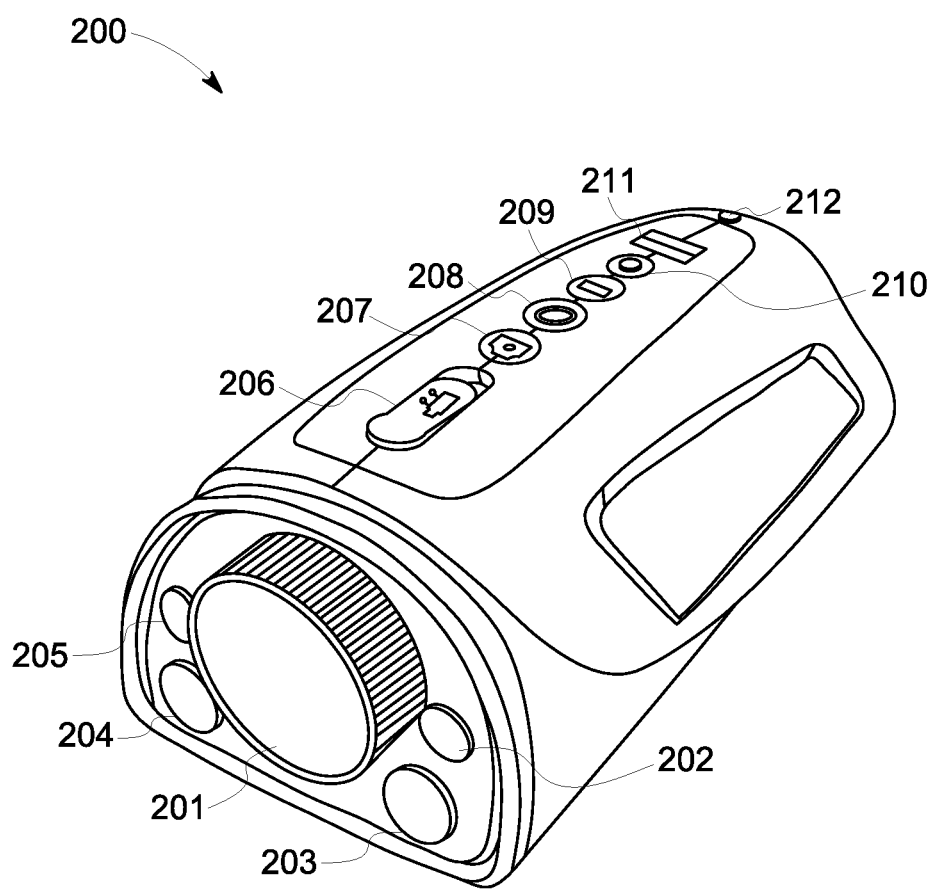
FIG. 2 depicts a front perspective view of the exemplary camera according to an embodiment of the invention.

Referring to FIG. 2, the front view of the camera 200 comprises a rotatable lens 201, a light source 202, a first infrared light source 203, a second infrared light source 204, a photo-sensitivity sensor 205, a recorder button 206, an image capturing button 207, an on/off button 208, an identification chip activation button 209, an infrared activation button 210, a speaker 211 and a wireless communication 212 i.e., Wi-Fi.

The camera 200 may include the light source 202 as an indicator. The light source 202 can be placed on the desired side of the camera 200. The white light source can be utilized as the indicator. The other coloured light sources can be utilized instead of white light source. This provides the indication of different functions of the camera components. Further, other types of indications such as audible or tactile feedbacks can be configured within the camera 200. The first and second infrared light sources 203 and 204 allow for the IR image capturing which is accomplished either automatically or manually through infrared activation button 210.

The photo-sensitivity sensor 205 assists in adjusting the light sensitivity of the image to be captured. The recorder button 206 allows for recording the audio and video. The identification chip activation button 209 allows for the communication, through Subscriber Identity Module (SIM) card. The speaker 211 allows to carry out either Push-To-Talk communication or sim card communication.

Figure 3:
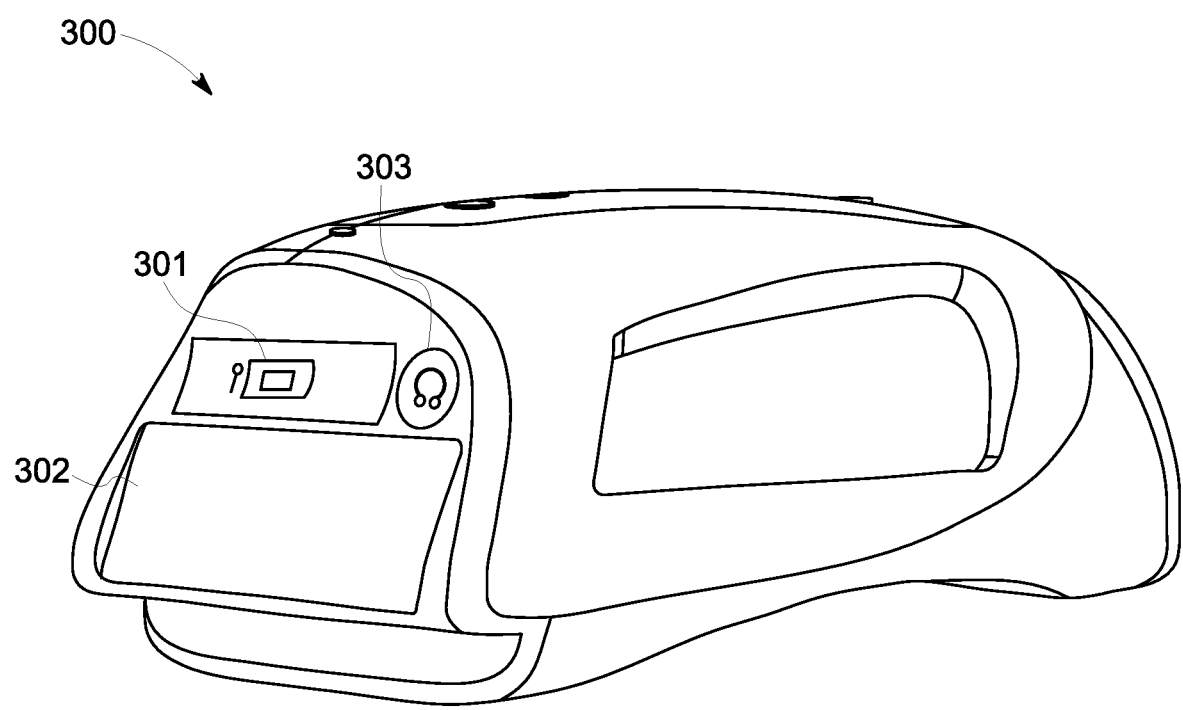
FIG. 3 depicts a back perspective view of the exemplary camera according to an embodiment of the invention.

Referring to FIG. 3, the back view of the camera 300 comprises an identification chip slot 301, a wireless power charging USB port 302 and a earpiece button 303. The identification chip slot 301 allows for the insertion of the SIM card. The wireless power charging USB port 302 is configured to charge the camera battery wirelessly. The earpiece button 303 is configured to activate the wireless earpiece manually.

Figure 4:
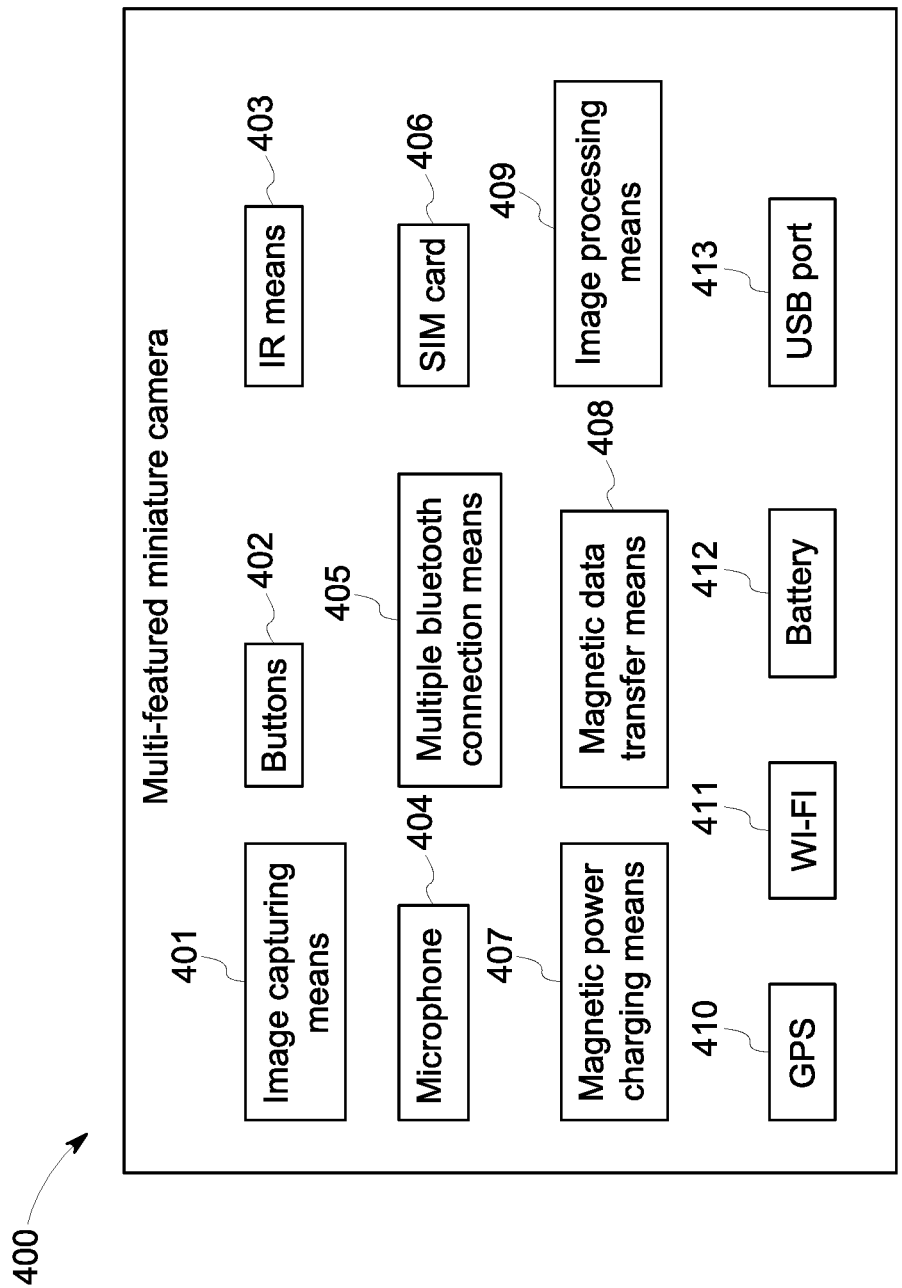
FIG. 4 is an exemplary simplified block diagram of the multi-featured miniature camera, illustrating various features.

Referring to FIG. 4, the block diagram of the multi-featured miniature camera 400 comprises an image capturing module 401 with rotatable lens, buttons 402, an infrared radiating (IR) means 403, a microphone 404, multiple Bluetooth transceivers 405, an identification chip means i.e., Subscriber Identity Module (SIM) card 406, a wireless power charging means i.e., magnetic power charging means 407, a wireless data transceiver i.e., magnetic data transfer means 408, an image processing means 409, a location determination means i.e., GPS 410, an additional wireless communication i.e., Wi-Fi 411, a battery 412 and a USB port 413.

The buttons 402 are configured to activate multiple features of the camera 400. The features include image capturing, recording, infrared image capturing, Push-To-Talk, GPS, Wi-Fi, live streaming, real time transfer etc. The IR means 403 is configured to capture IR images either automatically or manually. The automatic activation of the IR means 403 is achieved by providing an IR sensor, whereas manual activation is achieved through the buttons provided on the camera 400. The microphone 404 configured may comprise three components to accomplish multiple tasks such as noise reduction, Push-To-Talk (PTT) function and video and audio recordings.

The multiple Bluetooth connection means 405 is configured to connect multiple Bluetooth enabled accessories such as an ear-piece, a mouthpiece and a finger ring. The multiple Bluetooth enabled accessories can be connected either simultaneously or individually based on the requirement. The Bluetooth enabled accessories such as an ear-piece and a mouthpiece may assist the user, either during the mobile communication or during PTT communication. The finger ring assists the user, mainly to activate the PTT communication. The SIM card 406 is configured to enable the mobile communication and to broadcast live streaming of the moving images.

The magnetic power charging means 407 is configured to charge the power to the camera 400 wirelessly and the magnetic data transfer means 408 is configured to transfer data wirelessly. To carry out the magnetic charging and the magnetic data transfer, the camera 400 may be equipped with transmitting and receiving coils. The image processing means 409 is configured to process the image recognition of the captured images which may involve the detection of size of the deviation of specific image from the predetermined reference position, magnitude of the deviation and thereof.

The GPS 410 is configured to track location of the camera 400 and to record the time and location of the recorded audio and video data. The wireless communication Wi-Fi 411 can be utilized to broadcast live streaming of the moving images, to connect other electronic device etc. The battery 412 may be a rechargeable battery that is charged wirelessly through USB port 413.

Figure 5:
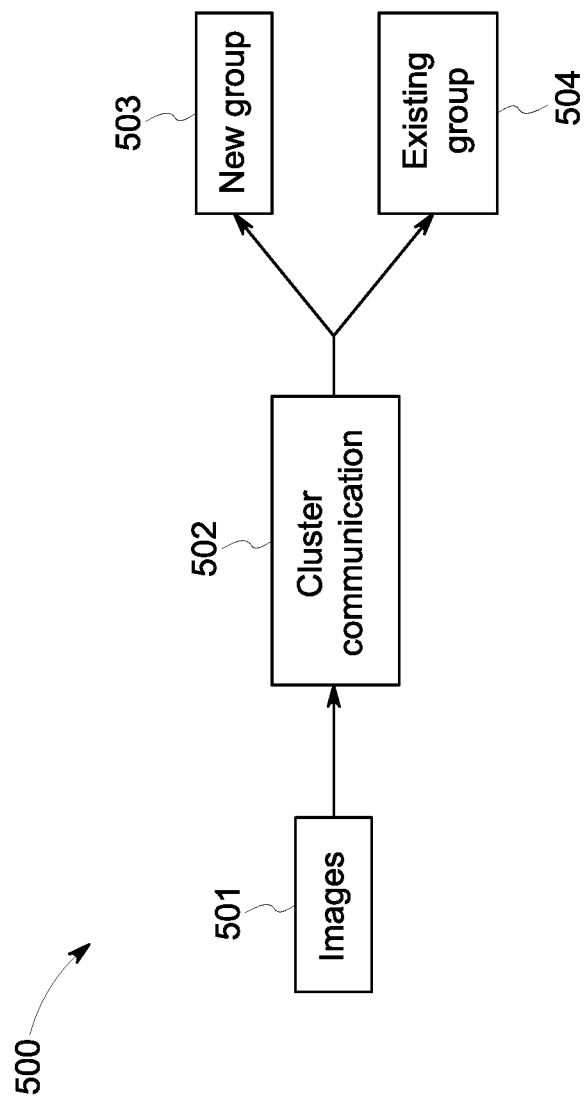
FIG. 5 is an exemplary block diagram of wireless data transfer using cluster communication.

Referring to FIG. 5, the wireless data transfer i.e., transfer of moving or still images can be achieved using cluster communication technology 500. A collection of the moving or still images 501 can be easily transferred or shared to a new group 503 or an existing group 504 through the cluster communication 502. The transfer of data containing multiple still images or moving images or video to other electronic devices or to a cluster of devices is accomplished directly through cluster communication methodology without any intermediate processing or layer. This data transfer system provides a hassle-free communication to the rescue officer to carry out the rescue operation without any trouble. The camera doesn't require any mobile or application program outside the camera to transfer or process the data or information or images or video, to any of the devices or cluster of devices. The camera has the ability to directly transfer the information to required destination. The images can be sent to the new group 503 by creating the group with the addition of certain devices, whereas the images can be sent to the existing group 504 by selecting the already created group.

Figure 6:
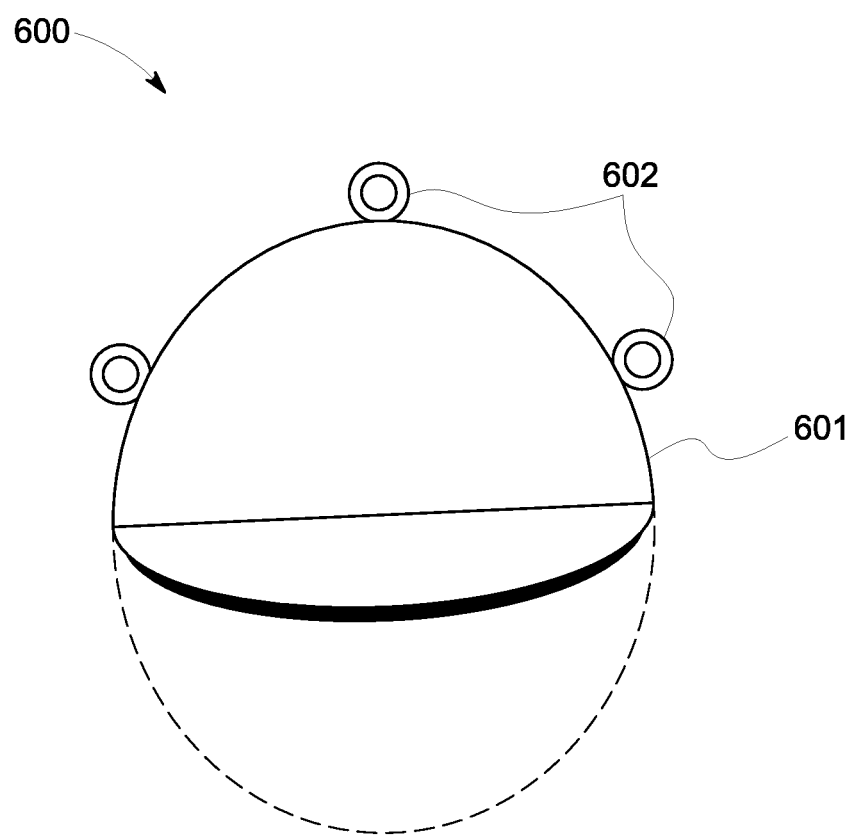
FIG. 6 illustrates the multiple placement of the camera on a helmet.

Referring to FIG. 6, a user wearable helmet 601 is depicted with two or more cameras 602 placement especially to cover multiple directions during search operations.

Referring to FIG. 7, a multiple Bluetooth transceivers is illustrated in connection with three Bluetooth enabled accessories 700. FIG. 7 represents the camera which is equipped with the multiple Bluetooth transceivers 701. The multiple Bluetooth transceivers 701 is capable of connecting two or more Bluetooth enabled accessories either simultaneously or individually. The Bluetooth enabled accessories depicted in the figure are an earpiece 702, a mouthpiece 703 and a finger ring 704. The finger ring 704 is provided with an activation button that assists in activating the Push-To-Talk (PTT) communication.

For example, when a Push-To-Talk (PTT) function is to be carried out, the user may simply press the activating button provided on the finger ring 704. The multiple Bluetooth transceivers 701 then receives the activation signal and activates the PTT communication. At the same time, to carry out the PTT communication, the multiple Bluetooth transceivers 701, also activates the earpiece 702 and the mouthpiece 703. During the PTT conversation, video recording is also carried out to send live streaming through the activation of the image capturing module. The camera can transfer the same video or image across all the Bluetooth devices either simultaneously or separately. The camera can transfer one function i.e., the video among multiple Bluetooth devices that is more than one pair.

Thus, the miniature camera with multiple improved features is mounted on multiple application areas such as on helmets of police officers, sport players, firefighters etc. It incorporates with a contour design that assists to easily fit on the helmet. Multiple Bluetooth connection means allow the camera to connect with multiple Bluetooth enabled accessories either individually or simultaneously. In addition, the camera also includes image recognition process and cluster communication.

The invention mainly aims to provide a helmet mounted camera which can be mounted on the helmet of the police officers, firefighters, traffic police officers, and it aims at providing underground mining detection, real-time navigation positioning function, a hands-free voice communication, projection display and thereof. The other application areas where the camera can be mounted include face masks, face guards or other suitable structures. The camera can be mounted on the exterior surface of the helmets or made as an integral part of the helmet. The camera can be integrated either during the manufacturing or during the assembly process of the helmet. The camera can be added to the docking station which assists to recharge the battery and also can be recharged with external battery pack. The camera is configured to be water resistant where the camera can go up to 10 feet depth in water.

The proposed multi-featured miniature camera, even though explained as a helmet wearable device, but also can be implemented in other application areas where a lesser size camera with multi features and high performance is required. The camera may be compatible to incorporate the SIM card with either existed supporting technology or upgraded technology to carry out the mobile communication or live streaming. To further implement data security, a secret key or a password can be maintained, so that the camera can be connected to other electronic devices with the user authentication.

The camera body can further include different designs other than contour design based on the requirement. The buttons employed on the camera body may comprise of a push-type, touch-type, rotary-type etc. The Bluetooth enabled accessory can include any electronic device which is capable enough to communicate via Bluetooth. The magnetic power or data transfer means may include additional component that aids in wireless transfer other than USB port. The other features of the camera include water resistant, wide memory storage and multiple wireless communications such as Bluetooth, Wi-Fi, and any one or combination of 2G or 3G or 4G. The camera design allows it to easily fit on the helmet and ensures stable image capturing.

Further, the GPS is provided with a receiver which is integrated to enable tracking of the location of the camera and periodic capture of the location to in turn acquire image information. This assists the capturing and transmitting of the images in real-time with the provision of the details of the captured image such as location, speed, time and thereof.

The invention thereby aims to provide a compact and lightweight, easy to carry, simple operated helmet cameras which mainly overcome the shortcomings of the traditional video evidence equipment. The camera provides a real-time video synchronization of the situation on the spot and simple & easy to use features. The dual lens allows the camera to cover wide field of view and to achieve enhanced image clarity. Further, the helmet can be manufactured with multiple additional mounting portions which may further allow to mount either an additional camera or to detachably mount the existing camera. The camera placement can be modified based on the requirement of the application area.

It will readily be apparent that numerous modifications and alterations can be made to the processes described in the foregoing examples without departing from the principles underlying the invention, and all such modifications and alterations are intended to be embraced by this application.

I claim:

1. A multi-featured miniature camera, comprises:
multiple Bluetooth transceivers to connect and use multiple Bluetooth enabled accessories either simultaneously or individually to carry out a Push-To-Talk (PTT) function;
an image recorder to get activate and capture images of either moving or still images while said multiple Bluetooth enabled accessories are in use to accomplish the PTT function, and wherein said PTT function includes pressing the activating button provided on a finger ring, receiving the activation signal by multiple Bluetooth connection means and activating the PTT communication, wherein the image recorder is configured with two rotatable lenses to effect the captured images in a predetermined predictable manner;
an image processor to process image recognition of the captured images;
a wireless data transceiver to transfer said processed images using cluster communication during the PTT function across multiple Bluetooth devices either simultaneously or separately; and
multiple activating switches arranged on the body of said miniature camera to allow manual activation of said image recorder, said multiple Bluetooth transceivers, said wireless data transceiver and other multiple features.

2. The multi-featured miniature camera as recited in claim 1, wherein said wireless data transceiver that transfers said processed images during the PTT function across said multiple Bluetooth devices either simultaneously or separately is a magnetic data transceiver.

3. The multi-featured miniature camera as recited in claim 1, wherein said other multiple features comprises infrared image capture, Push-To-Talk, GPS, Wi-Fi, live streaming, real time transfer etc.

4. The multi-featured miniature camera as recited in claim 1, wherein the image recorder which gets activated and capture images of either moving or still images is a camera.

* * * * *